United States Patent [19]

Scheler et al.

[11] Patent Number: 5,306,595

[45] Date of Patent: * Apr. 26, 1994

[54] COMPOSITION CONTAINING NAPHTHOQUINONE DIAZIDE SULFONIC ACID MIXED ESTERS AND RADIATION-SENSITIVE RECORDING MATERIAL PREPARED THEREWITH

[75] Inventors: Siegfried Scheler, Wiesbaden-Naurod; Wolfgang Zahn, Eltville; Axel Schmitt, Walluf; Gerhard Buhr, Koenigstein, all of Fed. Rep. of Germany

[73] Assignee: Hoechst Aktiengesellschaft, Frankfurt am Main, Fed. Rep. of Germany

[*] Notice: The portion of the term of this patent subsequent to Dec. 7, 2010 has been disclaimed.

[21] Appl. No.: 862,603

[22] Filed: Apr. 1, 1992

[30] Foreign Application Priority Data

Apr. 9, 1991 [DE] Fed. Rep. of Germany ....... 4111444

[51] Int. Cl.$^5$ ................................. G03C 1/52
[52] U.S. Cl. ................................ 430/191; 430/190; 430/192; 430/193; 430/165; 430/166
[58] Field of Search ............... 430/190, 192, 193, 191, 430/165, 166

[56] References Cited

U.S. PATENT DOCUMENTS

| | | | |
|---|---|---|---|
| 4,404,272 | 9/1983 | Stahlhofen | 430/192 |
| 4,581,321 | 4/1986 | Stahlhofen | 430/325 |
| 4,732,836 | 3/1988 | Potvin et al. | 430/192 |
| 4,871,645 | 10/1989 | Uenishi et al. | 430/192 |
| 4,902,785 | 2/1990 | Potvin et al. | 534/557 |
| 5,035,976 | 7/1991 | Potvin et al. | 430/192 |
| 5,162,516 | 11/1992 | Potvin et al. | 430/192 |

FOREIGN PATENT DOCUMENTS

| | | |
|---|---|---|
| 244763 | 11/1987 | European Pat. Off. . |
| 212482 | 4/1989 | European Pat. Off. . |
| 0369219 | 5/1990 | European Pat. Off. . |
| 3325022 | 1/1985 | Fed. Rep. of Germany . |
| 3839906 | 6/1989 | Fed. Rep. of Germany . |
| 3837500 | 5/1990 | Fed. Rep. of Germany . |
| 2212933 | 8/1989 | United Kingdom . |

OTHER PUBLICATIONS

A. Knop et al., "Chemistry and Application of Phenol Resins", Kapitel 4, Springer-Verlag, 1979, pp. 60–67.
P. Trefonas III, et al., "New Principle for Image Enhancement in Single Layer Positive Photoresists", SPIE Advances in Resist Technology and Processing IV, vol. 771, 1987, pp. 194–210.
P. Trefonas III, et al., "Photoresist Design for Submicron Optical Lithograph: Application of Polyphotolysis", Solid State Technology, Aug. 1987, pp. 131–137.

*Primary Examiner*—Charles L. Bowers, Jr.
*Assistant Examiner*—Geraldine Letscher
*Attorney, Agent, or Firm*—Foley & Lardner

[57] ABSTRACT

The present invention relates to a radiation-sensitive composition containing a resinous binder which is insoluble in water, but soluble or at least swellable in aqueous alkaline solutions, at least one radiation-sensitive compound and optionally a crosslinking agent. The radiation-sensitive compound is an ester composed of a) a compound containing 2 to 6 aromatic hydroxyl groups, b) a ring-substituted (o-naphthoquinone 2-diazide)-4-sulfonic acid (diazo compound $D_1$) and c) an (o-naphthoquinone 2-diazide)-4- or -5-sulfonic acid which is not further substituted (diazo compound $D_2$) and/or a non-radiation-sensitive organic acid (compound $D_0$), where the $D_1:(D_2$ and/or $D_0)$ molar ratio is between about 0.1:1 and 30:1.

20 Claims, No Drawings

COMPOSITION CONTAINING NAPHTHOQUINONE DIAZIDE SULFONIC ACID MIXED ESTERS AND RADIATION-SENSITIVE RECORDING MATERIAL PREPARED THEREWITH

BACKGROUND OF THE INVENTION

The present invention relates to a radiation-sensitive composition containing a resinous binder which is insoluble in water, but is soluble or at least swellable in aqueous alkaline solutions and at least one radiation-sensitive compound.

The radiation-sensitive layer of standard copying materials is essentially composed of a mixture of an alkali-soluble cresol formaldehyde novolak with radiation-sensitive compounds, such as 1,2-benzo- or o-naphthoquinone 2-diazide derivatives. The novolak is soluble per se in aqueous alkaline solutions, but the radiation-sensitive o-quinone diazide compounds act as solution inhibitors. In the imagewise exposure of the layer to actinic radiation, the radiation-sensitive diazocarbonyl compound is converted into a carboxylic acid via a ketene intermediate. The carboxylic acid is readily soluble in aqueous alkaline solution and, consequently, also enhances the solubility of the novolak. The preparation of novolaks is described, for example, by A. Knop and W. Scheib in "Chemistry and Application of Phenol Resins," chapter 4, Springer, New York 1979.

The exposed regions of the copying layer dissolve in the alkaline developer solution, while the unexposed regions remain essentially unaltered and intact, with the result that a positive relief image of the master is produced on the layer support.

The solubility behavior described can, however, also be reversed. For this purpose, the recording layer is subjected to a heat treatment after imagewise irradiation. Under these circumstances, the resin molecules of the layer crosslink in the regions of the layer affected by the light. The process, referred to as "hardening", requires, as a rule, the presence of a "crosslinking agent" which brings about the crosslinking and, consequently, the hardening during the heat treatment, under the influence of the acid which has been produced from the o-quinone diazide during the exposure. During hardening, heating is carried out to temperatures below the decomposition temperature of the o-quinone diazide. Heating can be carried out by irradiation, placing into a stream of hot gas, contact with heated surfaces, for example with heated rollers, or by immersion in a heated bath of an inert liquid, for example water. The temperature is in general between 90° and 150° C., preferably between 100° and 130° C.

Efficient crosslinking agents are generally compounds which readily form a carbonium ion under the acid and temperature conditions described. Examples of these are the hexamethylolmelamine ethers in accordance with DE-A 33 25 022 (=U.S. Pat. No. 4,581,321) and also the compounds described in EP-A 0 212 482, such as 1,4-bishydroxymethylbenzene and 4,4'-bismethoxymethyl diphenyl ether, which contain two or more aromatically bound hydroxymethyl or alkoxymethyl groups. 2,6-Bishydroxymethyl-4-methylphenol in accordance with U.S. Pat. No. 4,404,272 is also known as a crosslinking agent.

After the heat treatment, the photoresist layer is, as a rule, subjected to a whole-surface exposure ("flood exposure") in order to render the still radiation-sensitive layer regions completely alkali-soluble. The flood exposure is in general carried out with the same light source which was also used for the image exposure.

The development following the flood exposure is in general carried out with one of the aqueous alkaline solutions which are also used to develop a positive-working photoresist. These are, for example, aqueous solutions of sodium hydroxide, tetramethylammonium hydroxide, trimethyl(hydroxyethyl)ammonium hydroxide, alkali-metal phosphates, alkali-metal silicates or alkali-metal carbonates, which solutions may contain wetting agents or fairly small amounts of organic solvents. During the development, the layer regions not affected by light in the original image exposure are washed out, with the result that a negative resist image of the master is obtained.

In most cases, the exposed and developed resist material is then treated with an etchant, in which process the etchant is only able to act on the layer support in the non-image regions. In this way, a negative etching image is produced on the layer support in the case of a positive-working copying layer and a positive etching image in the case of a negative-working copying layer.

The positive or negative relief image of the copying layer produced on the layer support by the processes described is suitable for various application purposes, inter alia as exposure mask or as image in the production of semiconductor components in microelectronics, as printing forms for letterpress, gravure or lithographic printing, and also for the production of nickel rotation cylinders in an electroplating process.

The commercial suitability of a copying layer, for example a photoresist layer, is assessed, inter alia, on the basis of the radiation-sensitivity, the development and image contrast, the resolution and the adhesion to the layer support.

A high radiation sensitivity of the composition is an important factor in the manufacture of microelectronic circuits or components, especially in the so-called "inline" processing of wafers, in which the throughput of wafers is determined by the longest lasting process step. With the relatively long exposure times hitherto necessary, the exposure equipment throughput is the limiting factor. The exposure equipment cycle times are too long, especially with monochromatic irradiation and with irradiation using shorter-wave actinic light, and this results in an unduly low production rate.

The resist resolution relates to the capability of a photoresist system to reproduce even the finest lines and gaps of a mask used for the exposure, the exposed and developed regions being required to exhibit a high degree of edge steepness and sharpness.

In many technical application fields, in particular in the production of semiconductor components in microelectronics, the photoresist has to achieve a particularly high resolution as very small line and gap widths ($<1$ $\mu m$) have to be reproduced. The ability to reproduce smallest details in the order of magnitude of 1 $\mu m$ and less is of the greatest importance for the large-scale production of integrated circuits on silicon chips and similar components. If photographic processes are used, the integration density on such a chip can be increased by increasing the resolving power of the photoresist.

It is known that the resolution of a photoresist increases if photoactive compounds containing a plurality of radiation-sensitive radicals in one molecule are present in it, since the radiation-sensitive component in the mixture is then increased. [P. Trefonas III and B. K. Daniels, "New Principle for Image Enhancement in Single Layer Positive Photoresists", SPIE Advances in Resist Technology and Processing IV, 771 (1987), 194–210; P. Trefonas III, B. K. Daniels and R. L. Fischer, "Photoresist Design for Submicron Optical Lithography: Application of Polyphotolysis", Solid State Technology 30 (1987), 131–137].

If the mixed esters mentioned in EP-A 0 244 762 and 0 244 763 are used, an improved resolution can already be observed. DE-A 38 37 500 reveals the superior properties of ring-substituted naphthoquinone diazide derivatives in lithographic applications. Esters of optionally substituted (o-naphthoquinone 2-diazide)-4- or -5-sulfonic acids with compounds which possess three or more aromatic hydroxyl groups often have, however, an unduly low solubility in the standard solvents, and this has the result that the resists prepared with these esters do not yet achieve an adequate resolution.

SUMMARY OF THE INVENTION

Accordingly, it is an object of the present invention to provide novel compositions exhibiting increased radiation-sensitivity and improved solubility in the solvents used in the industry.

Another object of the present invention is to provide a radiation-sensitive recording material employing the novel compositions.

In accomplishing the foregoing objectives, there has been provided, in accordance with one aspect of the present invention, a radiation-sensitive composition comprising a resinous binder which is insoluble in water but soluble or at least swellable in aqueous-alkaline solutions, and a radiation-sensitive compound which is an ester which is the condensation product of (a) a compound containing 2 to 6 aromatic hydroxyl groups, (b) a compound $D_1$ which is a ring-substituted (o-naphthoquinone 2-diazide)-4-sulfonic acid, and (c) at least one compound selected from the group consisting of a compound $D_2$ which is an (o-naphthoquinone 2-diazide)-4- or -5-sulfonic acid which is not further substituted and a compound $D_0$ which is a non-radiation-sensitive organic acid. The molar ratio (b):(c) (i.e., the molar ratio $D_1:(D_2$ and/or $D_0))$ is between about 0.1:1 and 30:1, preferably between 0.25:1 and 19:1, in particular between 1.5:1 and 9:1.

In accordance with another aspect of the present invention there is provided a radiation-sensitive recording material comprising a support and a radiation-sensitive layer applied thereto, wherein the layer comprises a radiation-sensitive composition as described above.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The invention provides a composition which contains, as the radiation-sensitive component, an ester composed of a) a compound containing 2 to 6 aromatic hydroxyl groups, b) a ring-substituted (o-naphthoquinone 2-diazide)-4-sulfonic acid (diazo compound $D_1$) and c) an (o-naphthoquinone 2-diazide)-4- or -5-sulfonic acid which is not further substituted (diazo compound $D_2$) and/or a non-radiation-sensitive organic acid (compound $D_0$), where the $D_1:(D_2$ and/or $D_0)$ molar ratio is between 0.1:1 and 30:1. The esters and their preparation are described in the co-pending patent application, Ser. No. 07/863,679 (corresponding to German Patent Application P 41 11 443.4) which is incorporated by reference. The alkali-soluble binder is preferably a novolak, a poly(vinylphenol) or a poly(vinylalkylphenol).

The radiation-sensitive composition is, in general, applied to a support material in the form of a solution in an organic solvent. Examples of solvents which can be used are glycol ethers, such as ethylene glycol monomethyl ether or monoethyl ether and also their acetates, such as propylene glycol methyl ether acetate, esters, such as ethyl or butyl acetate, ketones, such as methyl ethyl ketone, cyclopentanone and cyclohexanone and also aromatic hydrocarbons, such as toluene and xylenol. It is also possible to use mixtures of these solvents.

The amount of binder in the composition is, in general, about 15 to 99% by weight, preferably about 50 to 97% by weight and particularly preferably about 63 to 93% by weight, based on the total weight of the solid constituents in the radiation-sensitive composition.

The amount of radiation-sensitive compound is about 1 to 50% by weight and preferably about 3 to 35% by weight, based on the total weight of the solid constituents in the composition.

To prepare a solution of the radiation-sensitive composition, the binder and the radiation-sensitive compound are mixed with a sufficient quantity of solvent to give a solvent proportion of about 40 to 90% by weight, preferably about 60 to 85% by weight.

Before applying to a layer support, additives may be added to the radiation-sensitive solution, such as, cross-linking agents, dyes, levelling agents, plasticizers, adhesion promoters, development accelerators and surfactants, for example non-ionic surfactants.

Dyes which can be used include, for example, methyl violet 2B (C.I. 42 535), crystal violet (C.I. 42 555), malachite green (C.I. 42 000), Victoria Blue B (C.I. 44 045), neutral red (C.I. 50 040), coumarine dyes and styryl dyes, in accordance with EP-A 0 070 445 or DE-A 37 35 852. These dyes are added in an amount of about 1 to 10% by weight, based on the total weight of binder and radiation-sensitive compound.

Levelling agents can be used in an amount of up to about 5% by weight, based on the total weight of binder and radiation-sensitive compound.

Suitable plasticizers comprise, for example, phosphoric acid tri($\beta$-choroethyl)-ester, stearic acid, dicamphor, polypropylene, acetal resins, phenoxy resins and alkyd resins, which can be added in amounts of about 1 to 10% by weight, based on the total weight of binder and radiation-sensitive compound. The plasticizers added improve the coating characteristics of the composition and make it possible to apply the composition in a smooth and uniformly thick layer to the layer support.

Adhesion promoters which can be used to improve the adhesion of the composition to the support comprise specific silicon-organic compounds, for example, 3-aminopropyl-triethoxysilane, in an amount of up to about 4% by weight, based on the total weight of binder and radiation-sensitive compound.

Development accelerators comprise aromatic carboxylic acids or aromatic polyhydroxy compounds, such as polyhydroxybenzophenone, picric, nicotinic and nitrocinnamic acids, which can be added in an amount of up to about 20% by weight, based on the total weight of binder and radiation-sensitive compound. These accelerators lead to an increase in the solubility of the radiation-sensitive layer, both in the exposed and unexposed regions.

Development accelerators are therefore used in those applications in which the speed of development is of prime importance. Due to the addition of accelerators, the exposed regions of the layer are more rapidly dissolved by the developer but, at the same time, the development accelerators give rise to a relatively large loss of layer from the unexposed regions, which means that a loss of contrast may occur.

Suitable non-ionic surfactants comprise, for example polyethylene glycol-mono-nonylphenyl ether, -monooctylphenyl ether and -mono-dinonylphenyl ether, which are used in an amount of up to about 10% by weight, based on the total weight of binder and radiation-sensitive compound.

Suitable crosslinking agents are described in EP-A 0 212 482 and U.S. Pat. No. 4,404,272. These are generally added to a radiation-sensitive composition intended for use in a negative-working layer, for example, a negative-working photoresist. The crosslinking agents mainly comprise aromatic compounds containing two or more hydroxymethyl or alkoxymethyl groups in a molecule, such as 1,2-bishydroxymethylbenzene, 1,2-bis-methoxymethylbenzene, 1,2-bis-hydroxymethylfuran, 2,6-bis-hydroxymethyl-4-methylanisole, 1,4-bis-($\alpha$-hydroxybenzyl)benzene, 2,5-dimethyl-1,4-bis-hydroxymethylbenzene, 4,4'-bishydroxymethyldiphenylether, 4,4'-dimethoxy-diphenyl, 2,6-bis-hydroxymethyl-4-methoxy or -4-ethoxyphenol, 4,4'-bismethoxymethyldiphenylether and epoxy-cresol novolak resins and also alkoxymethylmelamine derivatives. Particularly preferred are: 2,6-bis-hydroxymethyl-4-methyl, -4-ethyl, -4-propyl, -4-isopropyl, -4-n-butyl, -4-tert.-butyl and -4-(2-phenyl-2-propyl)-phenol.

The crosslinking agents can be used in amounts of about 1.5 to 20% by weight, based on the total solids content of the radiationsensitive composition.

In the presence of acid and at elevated temperature, the binder molecules are "crosslinked" by these crosslinking agents, i.e., the radiation-sensitive layer is hardened. The acid required for hardening of the layer is formed as a result of the photoreaction of the radiation-sensitive compound.

The radiation-sensitive composition of the present invention exhibits an improved stability in solution and improved storability. Resolution is better than in comparable, prior art radiation-sensitive compositions.

The invention also relates to a radiation-sensitive recording material which comprises a layer support and a radiation-sensitive layer formed of a composition of the above-described type, and to a process for preparing the recording material.

Suitable support materials comprise, for example silicon, aluminum or polymeric resins, silicon oxide, doped silicon oxide, silicon nitride, tantalum, copper, polysilicon, ceramics and aluminum/copper alloys.

To prepare the recording material according to the present invention, the radiation-sensitive composition, for example a photoresist, can be applied to the support by processes customarily employed in industry, such as immersion, spray and spin-coating. In the spin-coating process, the solids component in the resist solution is adjusted in such a way that, depending on the spin-coating apparatus used in the individual case and the period of time fixed for the spin-coating operation, a coating in the desired thickness is obtained.

The radiation-sensitive compositions prepared according to the process described are particularly well suited for application to silicon wafers which carry a layer of silicon oxide, of the type employed in the manufacture of microprocessors and other semiconductor components for use in microelectronics. It is also possible to use a wafer of gallium arsenide, of aluminum carrying an oxide layer or of silicon carrying a layer of metallic aluminum or of oxidatively post-treated aluminum. The support may also be made of various polymeric resins, in particular of transparent polymers, such as polyesters.

After applying the radiation-sensitive composition to the layer support, the solid/liquid composite is subjected to a predrying operation at about 80° to 105° C. This heat treatment is continued until nearly all of the solvent has evaporated and a thin layer of about 1 $\mu$m remains on the support.

The coated support is then exposed imagewise, as is known in the art, using actinic radiation, in particular UV radiation having wavelengths of 248, 365, 405 or 436 nm, through appropriate masks, negatives or stencils etc. or exposed to directed electron emission or to the radiation of a laser. The term "actinic radiation" comprises both the X-ray region and electromagnetic radiation in the technically applicable wavelength range from 193 to 450 nm, and also electron emission.

For developing, the imagewise exposed recording materials are immersed in an aqueous alkaline developer solution. Spray developing processes are also frequently used in industry.

After removal from the developer solution, the material can be subjected to a heat treatment or burning-in treatment, respectively, to increase the adhesion and the chemical resistance of the layer to etching solutions and other substances. Heat treatment after development can comprise baking the layer and support in an oven at temperatures below the softening point of the layer.

For industrial applications, in particular in the manufacture of semiconductor components on silicon supports carrying a silicon oxide layer, the developed supports can be treated with a buffered etching solution based on hydrofluoric acid. The photoresist compositions of the present invention are resistant to acidic etching solutions and guarantee an effective protection of the unexposed regions of the support, which are coated with the photoresist composition.

The radiation-sensitive compositions according to this invention are not only suitable for use as photoresist compositions, but can also be employed for the preparation of printing plates and color proofing films.

If the recording material prepared by coating a support with the composition of the invention, which may additionally contain a crosslinking agent, is used in the negative-working image reversal process, imagewise exposure is followed by a second, short-term heat treatment at a temperature between about 90° and 150° C. During this heat treatment, the binder is hardened in the exposed regions of the photoresist layer. The heat treatment time varies between about 10 and 90 seconds. After heat treating and cooling the recording material, the photoresist layer is developed or is, preferably prior to developing, subjected to an overall UV irradiation (flood exposure). The developers used comprise aqueous alkaline solutions containing inorganic or quaternary organic bases. The developers may be buffered or contain additional additives (e.g wetting agents). In the developing process, the regions of the layer which remained unexposed during imagewise exposure are washed away, while the regions of the layer which were exposed during imagewise exposure are not attacked (negative process). As a result, a negative relief copy of the exposure mask is obtained.

It is also possible to combine positive and negative processes on a single layer support (photocomposing).

In the examples which follow, the radiation-sensitive compositions and recording materials of the present invention are further illustrated.

EXAMPLES

For lithographic comparison, radiation-sensitive compositions were formulated, which exclusively contain completely esterified derivatives of 2,3,4,4'-tetrahydroxybenzophenone (Examples 1 to 6) and of 2,3,4,3',4',5'-hexahydroxybenzophenone (Examples 7 to 10).

The derivatives are esterified with 7-methoxy-(1,2-naphthoquinone 2-diazide)-4-sulfonic acid ($D_1$) and (1,2-naphthoquinone 2-diazide)-4-sulfonic acid ($D_2$) in a $D_1:D_2$ molar ratio of 0.33:1 (Example 1) or 4.71:1 (Example 2). In Comparative Examples 3, 4 and 10, the hydroxybenzophenones are esterified only with (1,2-naphthoquinone 2-diazide)-4-sulfonic acid and in Comparative Examples 5 and 6 only with 7-methoxy-(1,2-naphthoquinone 2-diazide)-4-sulfonic acid.

In Examples 7 to 9, the hexahydroxybenzophenones are in each case esterified with 7-methoxy-(1,2-naphthoquinone 2-diazide)-4-sulfonic acid ($D_1$) and a non-radiation-sensitive acid ($D_0$) in a $D_1:D_0$ molar ratio of 5:1. The non-radiation-sensitive acid comprises stearic acid (Example 7), 2-ethylhexyl carbonate (employed as 2-ethylhexyl chloroformate) (Example 8) or methane sulfonic acid chloride (Example 9).

a) Compositions According to the Invention

A 26% concentration solution of a cresol/xylenol novolak in methoxypropanol acetate is prepared and, based on the novolak, 28% (in the case of derivatives of tetrahydroxybenzophenone) or 43% (in the case of derivatives of hexahydroxybenzophenone) of the photoactive compound are added to this solution and dissolved therein.

b) Comparative Examples

The corresponding naphthoquinone diazide is added to the novolak solution mentioned under a) above up to saturation of the solution and filtered off from undissolved material.

These resist solutions are used for spin-coating silicon wafers and the layers thus obtained are dried for 60 seconds on a hot plate at 90° C. The layer thickness is 1.30 μm. An exposure apparatus conventionally employed in industry is used for exposure through a mask containing patterns of various dimensions and after exposure, the layers are again heat treated for 60 seconds on the hot plate at 100° C. The regions of the layer affected by the light are then dissolved by means of a developer solution (development time 60 seconds) such that the unexposed regions of the layer remain on the silicon disk.

As shown by the Table below, considerably smaller patterns can be produced using the compositions of the present invention.

| Example No. | Normality of developer | Lithographic Characteristics Smallest patterns which can be resolved*) (dimensionally true reproduction of mask patterns) | Layer removal rate in the non-exposed region (nm/min) |
| --- | --- | --- | --- |
| 1 | 0.24 | 0.65 μm | 36 |
| 2 | 0.24 | 0.65 μm | 45 |
| 3 (comparison) | 0.24 | cannot be patterned | >1 300 |
| 4 (comparison) | 0.15 | cannot be patterned | 46 |
| 5 (comparison) | 0.24 | cannot be patterned | >1 300 |
| 6 (comparison) | 0.15 | cannot be patterned | 52 |
| 7 | 0.24 | 0.70 μm | 33 |
| 8 | 0.24 | 0.65 μm | 32 |
| 9 | 0.24 | 0.65 μm | 36 |
| 10 (comparison) | 0.24 | 1.15 μm | 71 |

*)Larger patterns are, at the same time, reproduced true to the mask

What is claimed is:

1. A radiation-sensitive composition comprising
   (i) a resinous binder which is insoluble in water but soluble or at least swellable in aqueous-alkaline solutions, and
   (ii) a radiation-sensitive compound which is an ester which is the condensation product of
      (a) a compound containing 2 to 6 aromatic hydroxyl groups,
      (b) a compound $D_1$ which is a ring-substituted (o-naphthoquinone 2-diazide)-4-sulfonic acid, and
      (c) a compound $D_2$ which is an (o-naphthoquinone 2-diazide)-4-sulfonic acid which is not further substituted or an (o-naphthoquinone 2-diazide)-5-sulfonic acid which is not further substituted,
   wherein the molar ratio (b):(c) is between about 0.1:1 and 30:1.

2. A radiation-sensitive composition as claimed in claim 1, wherein said resinous binder comprises a novolak, a poly(vinylphenol) or a poly(vinylalkylphenol).

3. A radiation-sensitive composition as claimed in claim 1, wherein the composition additionally comprises a crosslinking agent, a dye, a levelling agent, a plasticizer, an adhesion promoter, a development accelerator or a surfactant.

4. A radiation-sensitive composition as claimed in claim 1, wherein said binder is present in an amount of about 15 to 99% by weight, based on the solid consituents of the composition.

5. A radiation-sensitive composition as claimed in claim 1, wherein said radiation-sensitive compound is present in an amount from about 1 to 50% by weight, based on the solid constituents of the composition.

6. A radiation-sensitive composition as claimed in claim 5, wherein said radiation-sensitive compound is present in an amount from about 3 to 35% by weight, based on the solid constituents of the composition.

7. A radiation-sensitive composition as claimed in claim 1, consisting essentially of the recited constituents.

8. A radiation-sensitive composition as claimed in claim 1, wherein the molar ratio (b):(c) is between about 0.25:1 and 19:1.

9. A radiation-sensitive composition as claimed in claim 1, wherein the molar ratio (b):(c) is between about 1.5:1 and 9:1.

10. A radiation-sensitive recording material which comprises a layer support and a radiation-sensitive layer applied thereto, wherein said radiation-sensitive layer comprises a radiation-sensitive composition as claimed in claim 1.

11. A recording material as claimed in claim 10, wherein said layer support comprises a silicon or gallium arsenide wafer and contains at least one further layer applied between the support and the radiation-sensitive layer.

12. A recording material as claimed in claim 11, wherein said at least one further layer comprises an oxide or a metal.

13. A radiation-sensitive recording material which comprises a layer support and a radiation-sensitive layer applied thereto, wherein said radiation-sensitive layer consists essentially of a radiation-sensitive composition as claimed in claim 7.

14. A radiation-sensitive composition as claimed in claim 1, wherein (c) further comprises a compound $D_0$ which is a non-radiation sensitive organic acid.

15. A radiation-sensitive composition as claimed in claim 1, wherein (c) consists essentially of an (o-naphthoquinone 2-diazide)-4-sulfonic acid which is not further substituted.

16. A radiation-sensitive composition as claimed in claim 1, wherein (c) comprises an (o-naphthoquinone 2-diazide)-5-sulfonic acid which is not further substituted.

17. A radiation-sensitive composition as claimed in claim 1, wherein the compound (a) comprises a tetrahydroxybenzophenone or a hexahydroxybenzophenone.

18. A radiation-sensitive composition as claimed in claim 1, wherein (b) comprises 7-methoxy- (1,2-naphthoquinone 2-diazide)-4-sulfonic acid.

19. A radiation-sensitive composition as claimed in claim 1, wherein said molar ratio is between 0.25:1 and 9:1.

20. A radiation-sensitive composition as claimed in claim 14, wherein $D_0$ is stearic acid or 2-ethylhexyl carbonate.

* * * * *